United States Patent [19]

Jordan

[11] 4,065,198
[45] Dec. 27, 1977

[54] LED MOUNTING RETAINER AND DISPLAY

[75] Inventor: Thomas W. Jordan, Berkeley, Ill.

[73] Assignee: Wescom, Inc., Downers Grove, Ill.

[21] Appl. No.: 749,740

[22] Filed: Dec. 13, 1976

[51] Int. Cl.² .............................................. H05K 1/18
[52] U.S. Cl. .............................. 339/17 D; 339/210 R
[58] Field of Search ............... 339/17 C, 17 D, 61 L, 339/101, 108 L, 210 R, 210 M, 210 T, 278 L

[56] References Cited

U.S. PATENT DOCUMENTS

| 2,718,625 | 9/1955 | Harrison | 339/17 D |
| 2,881,405 | 4/1959 | Yarbrough | 339/17 C |
| 3,335,387 | 8/1967 | Mueller | 339/17 D |
| 3,808,581 | 4/1974 | Murray | 339/210 T |

FOREIGN PATENT DOCUMENTS

| 1,268,240 | 5/1968 | Germany | 339/17 C |

OTHER PUBLICATIONS

Chatlos, Light-Emitting Diode Mounting Block, IBM Technical Disclosure Bulletin, vol. 15, No. 1 p. 48 June 1972.

Primary Examiner—Roy Lake
Assistant Examiner—Mark S. Bicks
Attorney, Agent, or Firm—Leydig, Voit, Osann, Mayer & Holt, Ltd.

[57] ABSTRACT

An LED mounting retainer and a printed circuit board display using such retainer for firmly mounting LED's on a printed circuit board with the LED axis parallel to the board and spaced at a precisely determined standoff distance from the board. The retainer is a unitary injection molded plastic element having a body and a locking member joined by a hinge. The body has a recess for receiving the LED, the recess having apertures for allowing the LED leads to project therethrough. The locking member in being pivoted to a locked position engages the leads to bend them about 90° from their initial orientation, causing the leads to project below a mounting surface on the LED retainer, to produce a right angle indicator assembly.

14 Claims, 7 Drawing Figures

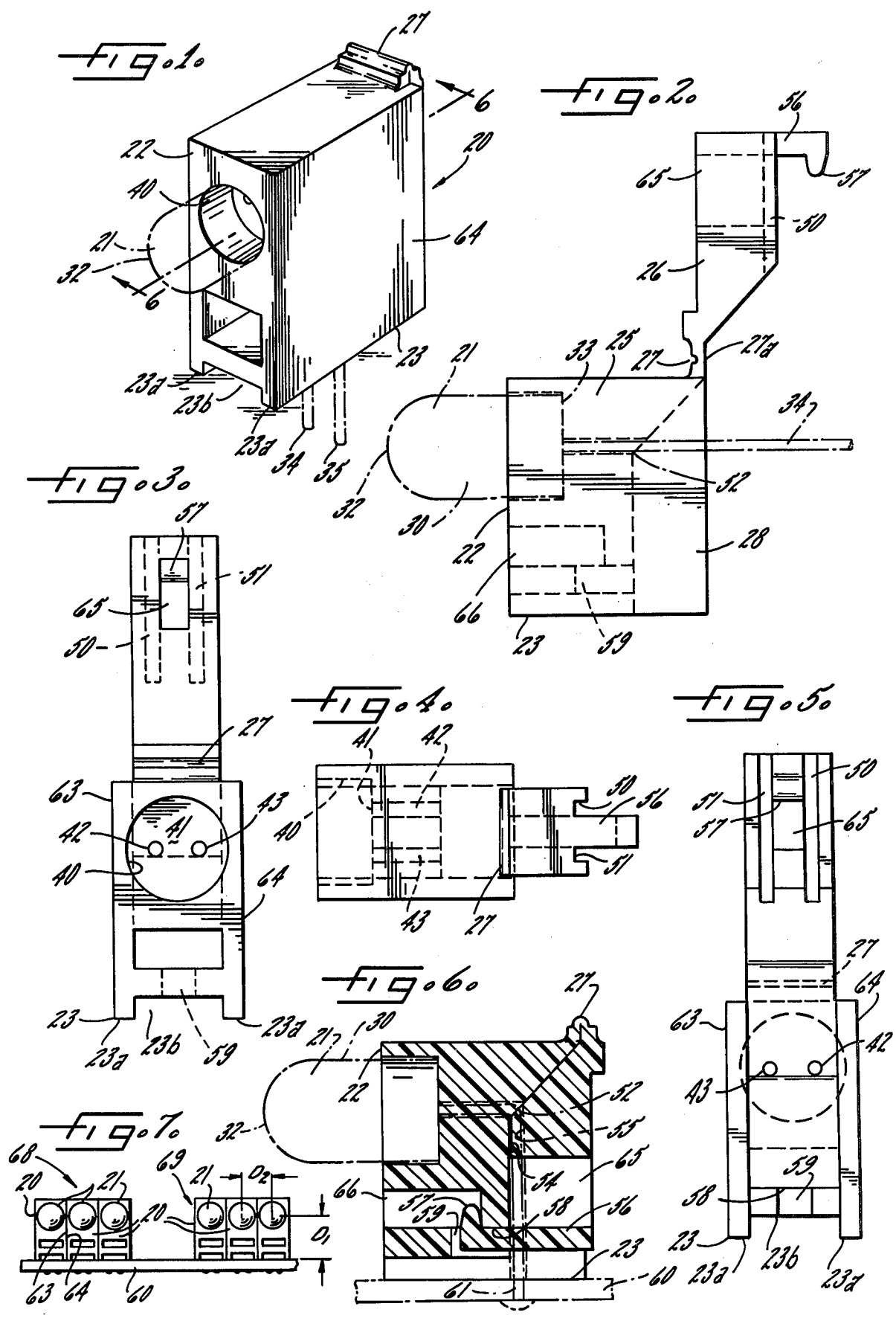

LED MOUNTING RETAINER AND DISPLAY

This invention relates to indicator mounts, and more particularly to those for mounting light emitting diodes (LED's) on but at right angles to printed circuit boards or the like.

LED's are becoming increasingly popular as indicators in electrical and electronic devices. Because they are much more reliable than indicator lamps previously used, there is little need to install them in sockets designed to allow ready replacement. Furthermore, LED's are typically low power devices, and sockets might introduce contact resistance problems. Basically, a light emitting diode is a semiconductor device, and is packaged much like other semiconductor devices with a cylindrical or domed body section and leads projecting from a flat base portion. When the LED is to be mounted flush on a printed circuit board not unlike a transistor, with the base in contact with the board, mounting presents few problems. However, this approach is generally not suitable for high density packaging applications where it is necessary to mount the LED with the axis of the cylindrical portion generally parallel to the board. The problem becomes especially acute when it is necessary to mount the LED's to project apertures in cover panels or the like.

In panel situations, mounting hardware available from the LED manufacturers is usually used to secure the LED body to the panel, following which the leads or extensions thereof are connected to the printed circuit board. It will be appreciated that this is a rather time consuming process subject to further problems in that the solder connections must usually be made in a rather confined area, increasing the probability of improper solder joints. The prior art has approached the problem of mounting indicators on printed circuit boards most typically in the context of indicator lamps. Such prior art approaches are illustrated in the following U.S. Pat. Nos.: Mueller 3,335,387, Rueger 3,354,454, Murray 3,808,581, Howe et al. 3,798,588, Brzozowski 3,909,096, and Trevisiol 3,693,134. Typically these approaches require socket elements to mate the pins of the indicator, or other forms of lead extension, and do not use the indicator leads themselves for making the direct connection to the circuit board.

In view of the foregoing, it is a general aim of the present invention to provide a lockable mounting retainer for an LED capable of seating the LED and forming the leads when locked to provide a right angle indicator assembly for direct mounting on the surface of a printed circuit board.

An object of the present invention is to provide a mounting retainer for an LED capable of captivating the LED, forming the leads thereof at about 90° to provide direct connection to a circuit board, and having a base for seating on the circuit board to establish a predetermined standoff distance from the board. An additional object is to provide such a mounting retainer which is simple and economical to manufacture.

A more detailed object of the present invention is to provide a two section lockable LED mounting retainer for receiving an LED when open, and adapted to form the leads to circuit connecting position when locked. Further in that regard, it is an object to provide the respective sections with mating surfaces when locked for captivating the LED leads to securely hold the LED.

An object according to a further aspect of the invention is to provide a printed circuit board display having a plurality of lockable LED mounting retainers with LED's, the mounting retainer serving to form the LED leads to circuit connecting position and to precisely fix the position of the indicator portions with respect to the circuit board, These and other objects will become apparent from the following detailed description when taken in conjunction with the drawings in which:

FIG. 1 is a perspective view showing an LED mounting retainer on an enlarged scale in the locked condition with an LED indicated in phantom;

FIG. 2 is a side elevation showing the LED retainer in open position with an unformed LED inserted therein;

FIG. 3 is a front elevation of the retainer of FIG. 2 with LED removed;

FIGS. 4 and 5 are a plan view and a rear elevation, respectively, of the LED retainer of FIG. 3;

FIG. 6 is a section taken generally along the line 6—6 of FIG. 1; and

FIG. 7 is a front elevation showing a printed circuit board with a plurality of mounted LED's.

While the invention will be described in connection with a preferred embodiment, there is no intent to limit it to that embodiment. On the contrary, the intent is to cover all alternatives, modifications and equivalents included within the spirit and scope of the invention as defined by the appended claims.

Turning now to the drawings, in FIG. 1 there is indicated an LED mounting retainer 20 in the locked condition and showing an LED 21 in phantom, to provide a right angle indicator assembly ready for mounting. The mounting retainer, when locked, is generally boxlike in shape, and has an indicator face 22 for seating the LED 21, and a mounting face 23, adapted to be supported on a printed circuit board or the like, generally at right angles to the indicating face 22. As shown in greater detail in FIGS. 2—6, the preferred form of mounting retainer 20 includes a body portion 25, a locking portion 26 and hinge means 27 joining said portions. The body portion 25 is open (28) at the rear for receiving the locking portion 26 when swung to the closed position.

Before referring to the structure of the mounting retainer in greater detail, the construction of the LED itself will first be reviewed. It is noted that the LED is used in its unmodified commercially available form. The LED 21 has a generally cylindrical body 30 domed at one end 32, the domed portion forming the "viewing window" of the LED. Opposite the domed section 32 is a generally planar base 33, and projecting from the base at precisely determined locations are a pair of leads 34, 35. As shown in the unmodified condition (FIG. 2) the leads project from the base in generally parallel relationship to the axis of the body portion, that is, perpendicularly from the base.

Returning now to the mounting retainer, it is seen that the display face 22 is provided with a cylindrical recess 40 having a diameter adapted to slidingly receive the LED 32 when positioned therein. The recess 40 has a floor 41 for seating against the base 33 of the LED 21, and apertures 42, 43 in the floor positioned to allow the leads 34, 35 to project therethrough and hence through the body portion 25. The diameters of the cylindrical recess 40 and the apertures 42, 43 are only slightly larger than the diameters of the associated LED portions so that the LED may be slid into the mounting retainer without substantial effort but held in a rather precisely determined position, as illustrated in FIG. 2.

Following insertion of the LED into the recess provided therefor as described above, the locking member 26 comes into play for the purpose of forming the LED leads to provide a right angle mount and planar supporting base, and to captivate the leads to produce a single secure assembly. To that end, the locking means 26 is adapted to be pivoted toward the body section, the direction of pivoting corresponding to the direction in which the leads 34, 35 are to be bent. Preferably the locking portion 26 includes a pair of channels 50, 51 located and dimensioned so that the LED leads 34, 35 respectively fit into the channels as the locking portion 26 is swung toward the closed position. As will be appreciated from a consideration of FIG. 2, when the locking portion 26 is pivoted approximately 90° from the illustrated position, the channels 50, 51 come into contact with the leads 34, 35 and encompass such leads. The channels control the lead position from this point of first contact through the final locked position. As the locking member 26 is swung further toward the body portion 25, the leads are formed by bending them at the point 52, that is the point at which the leads project free of the apertures 42, 43. As the locking member 26 is progressively advanced into the cavity 28 the leads are further bent while the channels 50, 51 slide along the leads 34, 35 to ultimately assume the position illustrated in section in FIG. 6. In this position the leads are bent at substantially 90° to their initial orientation, and are captured at the mating surfaces 54, 55 of the body section and locking section respectively. For purposes of securing the assembly in this position, the locking member 26 includes an elongated arm 56 having a locking tongue 57. As the locking member is swung toward the closed position the tongue 57 is deflected by the lower land surface 58 of the body section until the locking member is pivoted to the fully closed position at which time the tongue 57 falls free of the land surface 58 and locks into aperture 59 provided for that purpose. As will be apparent from a consideration of FIG. 6, in this condition the LED is firmly captured within the mounting retainer, with the leads thereof bent at 90° from their initial orientation for easy insertion into aperture 61 in a printed circuit board 60, with the mounting retainer base 23 in contact with the board 60. The domed portion 32 of the LED 21 faces outwardly from the board, the axis of the LED being generally parallel to the board and spaced at a predetermined distance therefrom as determined by the distance between the base 23 and the axis of the aperture 40. In order to prevent the locking portion 26 from affecting the planar mounting base 23 (and to allow the locking member to be opened if necessary), in the illustrated embodiment the planar base 23 is formed of a pair of parallel runners 23a having a raised channel 23b interposed between the runners.

Even before insertion of the LED leads into the printed circuit board the LED is firmly captured in the mounting retainer, the lower portions of the leads 34, 35 being retained within the recesses 50, 51 and the right angle bend at 52 assisting in the retention of the LED in the retainer. This arrangement is very suitable for shipping of LED indicator assemblies, because the LED is securely captured in the retainer, is protected by the structure of the retainer, and has only the lower extremities of the leads 34, 35 projecting from the retainer, allowing the projecting leads to be inserted in styrofoam or the like for shipping a plurality of such indicator assemblies free from damage. When it is desired to mount the indicator assembly on a printed circuit board, the projecting portions of the leads 34, 35 are inserted through apertures 61 on the board so that the base 23 seats firmly on the board, thereby accurately establishing the standoff distance of the LED and solder connections made to electrically and mechanically connect the assembly to the printed circuit board.

In some cases it may be desirable to unlock an indicator assembly for releasing an LED, for replacement or the like. To that end an aperture 65 is provided in the locking member 26 adjacent the locking arm 56. Thus a technician may insert a pin or thin blade in the aperture 65 to depress the arm 56 to force the locking tongue 57 free of aperture 59, causing the retainer to snap open. A future aperture 66 is provided in the display face 22, allowing a blade to be inserted to directly depress the locking tongue 57, also causing the retainer to snap open.

The economics achievable with the assembly taught herein will be apparent to one skilled in this art. Initially the device may be manufactured by conventional injection molding techniques using a suitable plastic such as polypropylene. The various recesses, apertures and interlocking members are easily obtainable with injection molding techniques, and the hinge member 27 simply formed as a relieved section of the arm 27a joining the body and locking members. Because the leads of the LED are "automatically" formed to provide the only connection means, the need for expensive sockets, mating contacts or lead extensions in the assembly is completely eliminated. By virtue of the firm seating of the assembly on the board with electrical and mechanical connection affected soley by the LED leads, the need for auxiliary hardware (including conventional LED panel mounting hardware) is also eliminated.

As a further feature of the invention, the planar parallel sides 63, 64 of the indicator are used to establish a predetermined center to center spacing between indicators, allowing such indicators to be stacked in arrays 68, 69 as illustrated in FIG. 7. There is shown a printed circuit board LED display wherein printed circuit board 60 carries a plurality of LED indicators 20 with LED's 21 mounted therein. The standoff distance $D_1$ is accurately established by the structure of the mounting retainer described above. Furthermore, the center to center spacing between mounted LED's in an array, illustrated as $D_2$ is accurately established by the distance between the planar sides 63, 64 of the LED retainer. The showing of FIG. 7 is approximately in scale for a popular application of the invention, providing a standoff distance $D_1$ of about 0.375 inches and a center to center spacing $D_2$ of about 0.300 inches. With the position of the LED indicator portions 32 accurately determined by the mounting retainers and their respective locations on the printed circuit board, and with the position of the board accurately fixed by the card guides and connector of the rack in which it is mounted, it will be appreciated that a rack cover panel may be pre-drilled to accommodate these locations to produce an inexpensive but highly professional display configuration.

I claim as my invention:

1. A retainer for mounting an LED of the type having leads projecting perpendicularly from a base, said retainer comprising a body portion, a locking portion movable with respect to said body portion from an open to a closed position locked to said body portion, seating means on the body portion for seating the LED, a supporting base substantially at right angles to said seating means, apertures through the seating means for receiving said leads when the LED is seated and allowing said leads to project through said body portion, means on the locking portion for engaging the leads as the locking portion is moved toward said closed position to bend said leads toward said supporting base, said body portion and locking portion mating in said closed position to bend leads at substantially right angles for projection below said supporting base, thereby to form a right angle mount.

2. The retainer as set forth in claim 1 wherein said means engaging the leads includes channel means for receiving the leads and guiding same as said bends are formed.

3. The retainer as set forth in claim 2 wherein said body portion mates said locking portion to close said channel means thereby to captivate said leads.

4. A retainer for mounting an LED of the type having leads projecting perpendicularly from the base thereof, said retainer comprising a body portion, a locking portion, and hinge means pivotably joining said portions, a generally cylindrical recess in said body portion for receiving an LED, said recess having a floor for seating the base of the LED, apertures in said floor for receiving the leads of the LED so that said leads project through said body portion, means on the locking portion for engaging the projecting leads as said locking portion is pivoted to its closed position to progressively bend said leads and carry same toward said body portion, said locking portion and body portion having mating surfaces juxtaposed in said closed position for captivating said leads with substantially right angle bends formed therein, said retainer in said locked position having a base portion substantially at right angles to said captivated leads for providing a mounting surface.

5. The retainer as set forth in claim 4 wherein said means engaging the leads includes channel means for receiving the leads and guiding same as said bends are formed.

6. The retainer as set forth in claim 5 wherein said mating surfaces include said channel means and means closing the channel means in said closed position for captivating said leads.

7. The retainer as set forth in claim 4 wherein said body portion, locking portion and hinge means comprise a unitary molded plastic element.

8. The retainer as set forth in claim 4 wherein the body portion, locking portion and hinge means comprise a unitary plastic structure formed by injection molding.

9. The retainer as set forth in claim 8 wherein said plastic is polypropylene.

10. An LED mounting retainer comprising, a body portion and a locking portion, said body portion having a lower mounting surface and an indicating surface substantially at right angles thereto, a generally cylindrical recess in said indicating surface for seating an LED, apertures in the floor of the recess for receiving the leads of the LED and allowing said leads to project through said body portion, said body portion having a lock receiving recess for receiving the locking portion when moved to a locked position, means on the locking portion engaging the LED leads to progressively bend said leads toward said mounting surface as the locking portion progressively enters said lock receiving recess, said body portion and locking portion having mating surfaces in said locked position for forming a bend of substantially 90° in said LED leads thereby to form a right angle indicator.

11. The retainer as set forth in claim 10 wherein said means engaging the leads includes channel means for receiving the leads and guiding same as said bends are formed.

12. The retainer as set forth in claim 11 wherein said mating surfaces include said channel means and means closing the channel means in said closed position for captivating said leads.

13. A printed circuit board display comprising a printed circuit board; a light emitting diode having an indicator, a base opposite thereto and leads projecting perpendicularly from said base; a mounting retainer having a mounting surface for seating on the printed circuit board and an indicating face substantially perpendicular to said mounting surface, a cylindrical recess in said indicating face for receiving said LED, a floor within said recess for supporting the LED base, apertures in said floor for receiving the LED leads and allowing said leads to project through said retainer, locking means on said retainer for engaging said LED leads when moved from an open to a locked position for forming said leads at substantially right angles to project below said mounting surface, apertures in the printed circuit board for receiving said projecting LED leads, the locked retainer with LED being positioned on said printed circuit board with said leads projecting through said board apertures and said mounting surface on said board for precisely establishing the standoff distance of said indicator.

14. The display as set forth in claim 13 including a plurality of LED's and a similar plurality of mounting retainers each having one of said LED's mounted therein, each of said mounting retainers having substantially parallel sides joining said indicating face at substantially right angles and separated by a predetermined distance for establishing the center spacing for said indicators when juxtaposed in side by side relationship.

* * * * *